US010955761B2

(12) United States Patent
Butler et al.

(10) Patent No.: US 10,955,761 B2
(45) Date of Patent: Mar. 23, 2021

(54) LITHOGRAPHIC APPARATUS, LITHOGRAPHIC PROJECTION APPARATUS AND DEVICE MANUFACTURING METHOD

(71) Applicant: ASML NETHERLANDS B.V., Veldhoven (NL)

(72) Inventors: Hans Butler, Best (NL); Maurice Willem Jozef Etiënne Wijckmans, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/482,515

(22) PCT Filed: Jan. 11, 2018

(86) PCT No.: PCT/EP2018/050602
§ 371 (c)(1),
(2) Date: Jul. 31, 2019

(87) PCT Pub. No.: WO2018/141520
PCT Pub. Date: Aug. 9, 2018

(65) Prior Publication Data
US 2020/0050120 A1 Feb. 13, 2020

(30) Foreign Application Priority Data

Feb. 2, 2017 (EP) .................... 17154328

(51) Int. Cl.
G03F 7/20 (2006.01)
G03F 9/00 (2006.01)
(52) U.S. Cl.
CPC .......... G03F 7/709 (2013.01); G03F 7/70258 (2013.01); G03F 7/70825 (2013.01); G03F 7/70833 (2013.01); G03F 7/70883 (2013.01); G03F 9/7019 (2013.01)

(58) Field of Classification Search
None
See application file for complete search history.

(56) References Cited

U.S. PATENT DOCUMENTS 9,081,292 B2 7/2015 Hauf et al.
9,164,401 B2 10/2015 Loopstra et al.
(Continued)

FOREIGN PATENT DOCUMENTS

| JP | 2007-318118 A | 12/2007 |
| JP | 2012-500484 A | 1/2012 |
| JP | 2012-504328 A | 2/2012 |
| WO | WO 2010/020481 A1 | 2/2010 |
| WO | WO 2016/139012 A1 | 9/2016 |

OTHER PUBLICATIONS

International Search Report and Written Opinion of the International Searching Authority directed to related International Patent Application No. PCT/EP2018/050602, dated Apr. 10, 2018; 12 pages.

(Continued)

Primary Examiner — Michelle M Iacoletti
(74) Attorney, Agent, or Firm — Sterne, Kessler, Goldstein & Fox P.L.L.C.

(57) ABSTRACT

The present invention relates to a lithographic apparatus, comprising:
a projection system configured to project a patterned radiation beam onto a substrate, comprising optical elements,
a sensor frame,
a first position measurement system configured to measure a position of an optical element relative to the sensor frame, comprising a sensor adapted to monitor an optical element, with a sensor element mounted to the sensor frame,
a sensor frame support supporting the sensor frame on a reference, (Continued)

a force measurement device adapted to generate force measurement data relating to force exerted on the sensor frame by the sensor frame support, a position control device adapted to control the relative position of the substrate and the patterned radiation beam wherein the position control device is configured to receive the force measurement data and to control said relative position based on at least the force measurement data.

17 Claims, 5 Drawing Sheets

(56) References Cited

U.S. PATENT DOCUMENTS

| | | |
|---|---|---|
| 2003/0047693 A1 | 3/2003 | Lublin et al. |
| 2007/0263189 A1 | 11/2007 | Butler et al. |
| 2011/0149265 A1 | 6/2011 | Butler et al. |
| 2011/0170078 A1 | 7/2011 | Loopstra et al. |
| 2011/0194088 A1 | 8/2011 | Butler et al. |
| 2014/0185029 A1 | 7/2014 | Kwan et al. |
| 2015/0062596 A1 | 3/2015 | Kwan et al. |

OTHER PUBLICATIONS

International Preliminary Report on Patentability directed to related International Patent Application No. PCT/EP2018/050602, dated Aug. 6, 2019; 9 pages.

LITHOGRAPHIC APPARATUS, LITHOGRAPHIC PROJECTION APPARATUS AND DEVICE MANUFACTURING METHOD

CROSS-REFERENCE TO RELATED APPLICATIONS

This application is a 35 U.S.C. 371 National Phase of PCT Application No. PCT/EP2018/050602, filed on Jan. 11, 2018, which claims priority of EP application 17154328.3 which was filed on Feb. 2, 2017, both of which are hereby incorporated by reference herein in their entirety and which is incorporated herein in its entirety by reference.

BACKGROUND

Field of the Invention

The present invention relates to a lithographic apparatus, a lithographic projection apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Optical elements in a projection system of a lithographic apparatus need to be aligned very accurately relative to each other and relative to the substrate in order to obtain a good image quality from a patterned radiation beam that is projected onto that substrate. The position at which the patterned radiation beam hits the substrate also has to be controlled very accurately. The optical elements are therefore closely monitored by sensors. In particular, the position of each optical element is closely monitored.

For the monitoring of an optical element, at least one sensor is provided which has a sensor element which is mounted on a sensor frame. The sensor frame is separate from the frame onto which the optical element is mounted. When a deviation of the optimal position of an optical element is detected, this may be corrected by correcting the position of the optical element or by correcting the position of a stage or other substrate support onto which the substrate that has to receive the patterned radiation beam is arranged, or by a combination of both.

Mechanical deformation of the sensor frame is one of the effects that introduces inaccuracy in the position measurement of the position of the optical element. In order to be able to correct the measurement results, and therewith the relative position of the substrate and the patterned radiation beam, for this inaccuracy, it is desired to know the deformation of the sensor frame.

In known lithographic apparatus, the deformation of the sensor frame is determined by measuring the acceleration of the sensor frame. The acceleration of the sensor frame is proportional with the mechanical forces that are exerted onto the sensor frame, and from these forces the deformation of the sensor frame can be determined, e.g. by using a model, e.g. a finite element model, of the mechanical properties (e.g. stiffness) and geometry of the sensor frame.

However, acceleration sensors cannot be used reliably in advanced lithographic apparatuses, because the noise of the acceleration sensor is relatively large compared to the relatively small accelerations of the sensor frame. Furthermore, in the low frequencies, e.g. in the range of 0.01 Hz-1 Hz, the measurement accuracy of acceleration sensors is not sufficient for the purpose of determining the deformation of the sensor frame.

SUMMARY

It is desirable to provide a lithographic system in which the relative position of the substrate and the patterned radiation beam can be actively controlled.

According to an embodiment of the invention, there is provided a lithographic system, which system comprises:
  a projection system configured to project a patterned radiation beam onto a substrate; the projection system comprising a plurality of optical elements,
  a sensor frame,
  a first position measurement system configured to measure a position of at least one of the plurality of optical elements relative to the sensor frame, wherein the position measurement system comprises at least one sensor adapted to monitor an optical element, which sensor comprises at least one sensor element which is mounted to the sensor frame,
  a sensor frame support configured to support the sensor frame on a reference,
  a force measurement device which is adapted to generate force measurement data relating to a force which is exerted on the sensor frame by the sensor frame support,
  a position control device adapted to control the relative position of the substrate and the patterned radiation beam wherein the position control device is configured to receive the force measurement data and to control the relative position of the substrate and the patterned radiation beam based on at least the force measurement data.

In another embodiment of the invention, there is provided a lithographic apparatus comprising:
  an illumination system configured to condition a radiation beam;
  a support constructed to support a patterning device, the patterning device being capable of imparting the radiation beam with a pattern in its cross-section to form a patterned radiation beam;

a projection system configured to project a patterned radiation beam onto a substrate; the projection system comprising a plurality of optical elements, a sensor frame, a first position measurement system configured to measure a position of at least one of the plurality of optical elements relative to the sensor frame, wherein the position measurement system comprises at least one sensor adapted to monitor an optical element, which sensor comprises at least one sensor element which is mounted to the sensor frame, a sensor frame support configured to support the sensor frame on a reference, a force measurement device which is adapted to generate force measurement data relating to a force which is exerted on the sensor frame by the sensor frame support, a position control device adapted to control the relative position of the substrate and the patterned radiation beam wherein the position control device is configured to receive the force measurement data and to control the relative position of the substrate and the patterned radiation beam based on at least the force measurement data.

In another embodiment of the invention, there is provided a lithographic projection apparatus arranged to project a pattern from a patterning device onto a substrate, comprising:

a projection system configured to project a patterned radiation beam onto a substrate; the projection system comprising a plurality of optical elements, a sensor frame, a first position measurement system configured to measure a position of at least one of the plurality of optical elements relative to the sensor frame, wherein the position measurement system comprises at least one sensor adapted to monitor an optical element, which sensor comprises at least one sensor element which is mounted to the sensor frame, a sensor frame support configured to support the sensor frame on a reference, a force measurement device which is adapted to generate force measurement data relating to a force which is exerted on the sensor frame by the sensor frame support, a position control device adapted to control the relative position of the substrate and the patterned radiation beam wherein the position control device is configured to receive the force measurement data and to control the relative position of the substrate and the patterned radiation beam based on at least the force measurement data.

In another embodiment of the invention, there is provided a device manufacturing method comprising transferring a pattern from a patterning device onto a substrate, comprising the step of using a lithographic apparatus according to claim 1.

In another embodiment of the invention, there is provided a device manufacturing method comprising projecting a patterned radiation beam onto a substrate, comprising the step of using a lithographic apparatus according to claim 1.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
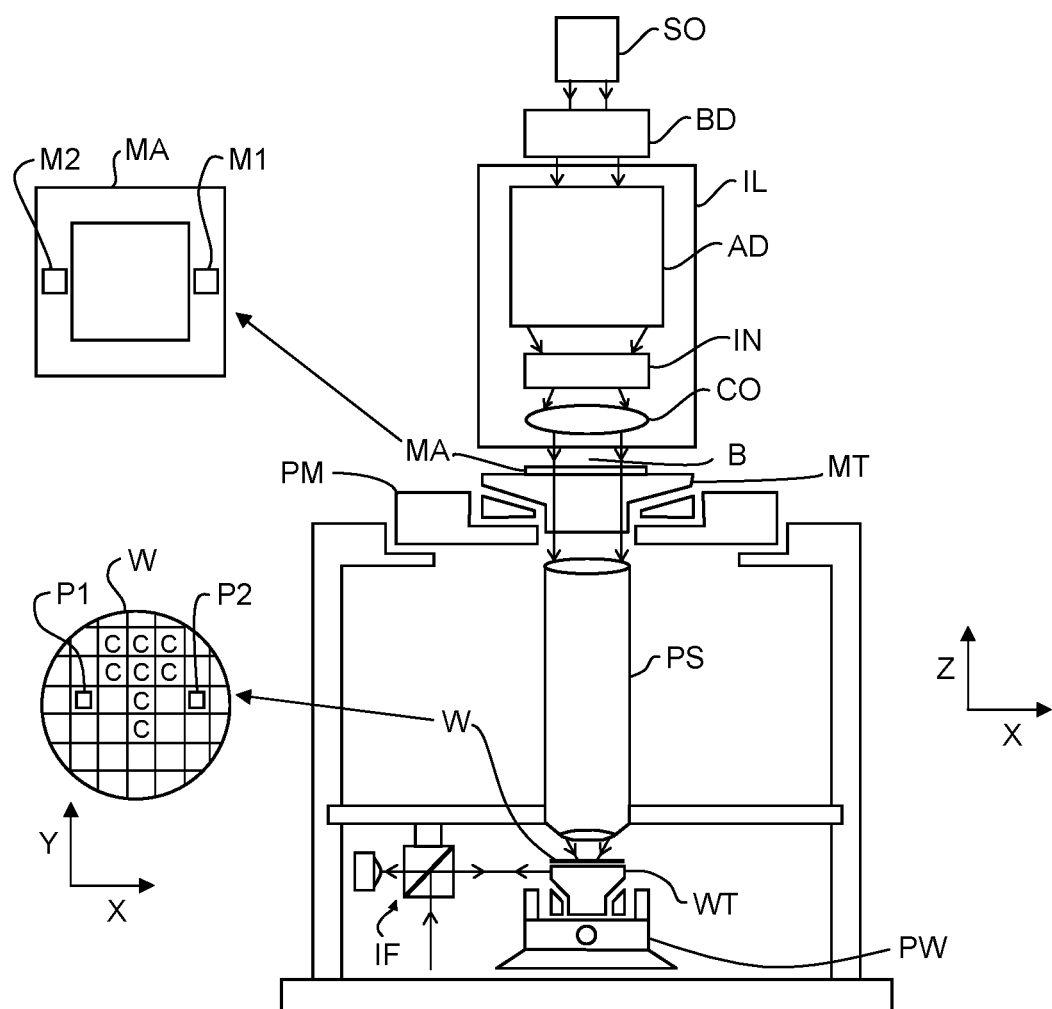
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. It holds the patterning device MA in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure MT may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure. In addition to the at least one substrate table WT, the lithographic apparatus may comprise a measurement table, which is arranged to perform measurements but is not arranged to hold a substrate W. The measurement table may be arranged to hold sensor to measure a property of the projection system PS, such as an intensity of the radiation beam B, an aberration of the projection system PS or a uniformity of the radiation beam B. The measurement table may be arranged to hold a cleaning device to clean at least a part of the lithographic apparatus, for example a part near a last lens element of the projection system PS.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The radiation source SO and the lithographic apparatus may be separate entities, for example when the source is an excimer laser. In such cases, the radiation source SO is not considered to form part of the lithographic apparatus and the radiation beam is passed from the radiation source SO to the illuminator IL with the aid of a beam delivery system BD including, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator IL may be used to condition the radiation beam, to have a desired uniformity and intensity distribution in its cross section.

The radiation beam B is incident on the patterning device MA, which is held on the mask support structure MT, and is patterned by the patterning device. Having traversed the patterning device MA, the radiation beam B passes through the projection system PS, which focuses the radiation beam B onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Such dedicated target portions are known as scribe-lane alignment marks). Similarly, in situations in which more than one die is provided on the patterning device MA, the mask alignment marks M1,M2 may be located between the dies.

The depicted apparatus could be used in at least one of the following modes:

1. In step mode, the mask support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask support structure MT and the substrate table WT or "substrate support" are scanned synchronously while a pattern imparted to the radiation beam is projected onto a target portion C (i.e. a single dynamic exposure). The velocity and direction of the substrate table WT relative to the mask support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion C.

3. In another mode, the mask support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
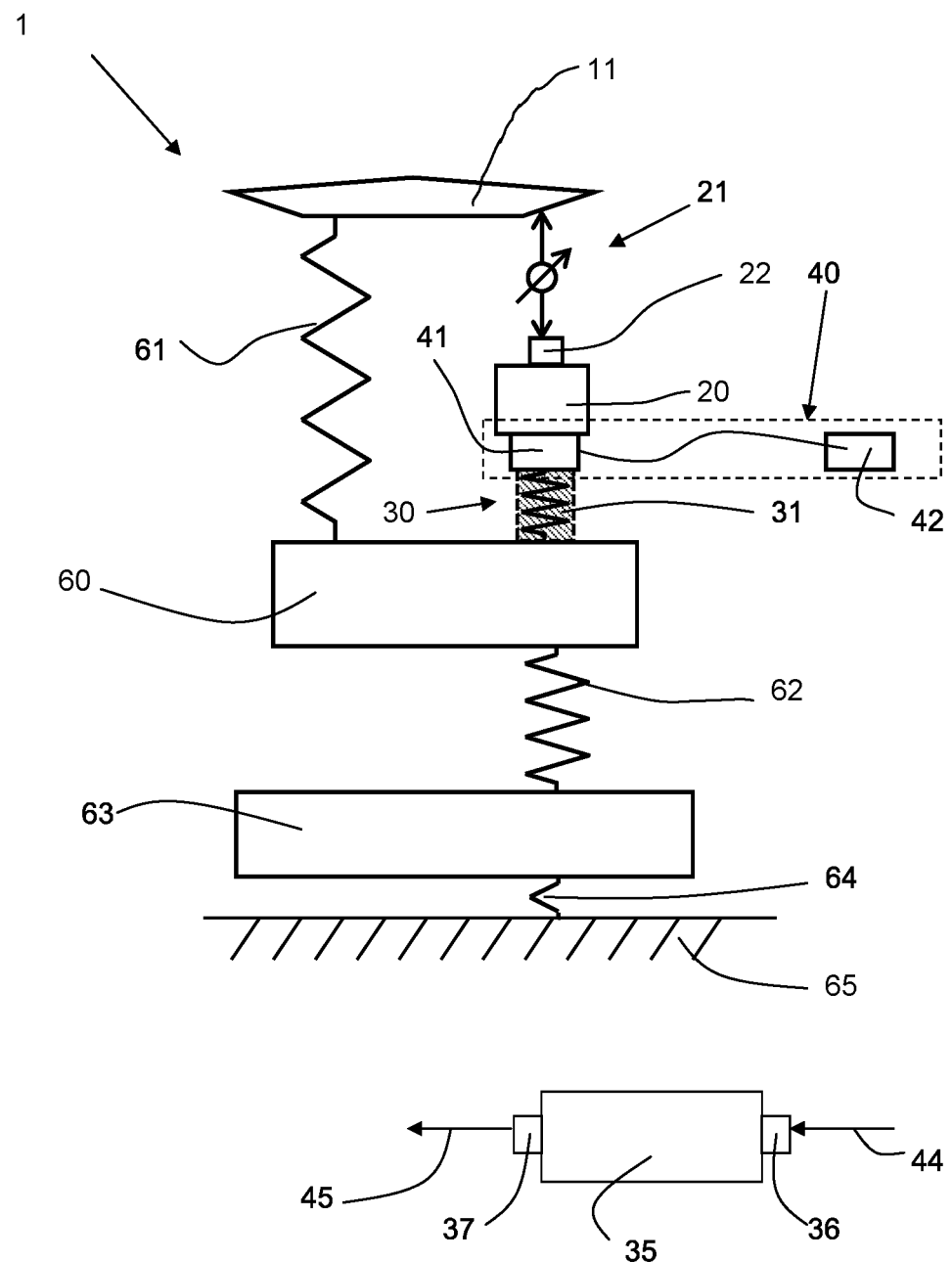
FIG. 2 schematically shows an embodiment a lithographic apparatus according to the invention, FIG. 3 schematically shows a further possible embodiment of a part of the lithographic apparatus according to the invention.

FIG. 2 schematically shows an embodiment a lithographic apparatus 1 according to the invention.

FIG. 2 shows one optical element 11 of the plurality of optical elements that is present in the projection system in the lithographic apparatus 1 according to the invention. The projection system is configured to project a patterned radiation beam onto a substrate which is arranged in the lithographic apparatus.

In the embodiment of FIG. 2, the lithographic apparatus 1 further comprises a sensor frame 20 and a first position measurement system 21 which is configured to measure a position of at least one of the plurality of optical elements relative to the sensor frame 20. In the embodiment of FIG. 2, the position measurement system 21 comprises at least one sensor adapted to monitor the optical element 11. The sensor comprises at least one sensor element 22 which is mounted to the sensor frame 20.

The embodiment of the lithographic apparatus 1 according to FIG. 2 further comprises a sensor frame support 30 which is configured to support the sensor frame 20 on a reference. The reference is for example a further frame which is present in the lithographic apparatus 1, such as a force frame 60 or a base frame. The force frame is the frame which supports the plurality of optical elements of the projection system, in particular the optical element 11.

In the embodiment of FIG. 2, the lithographic apparatus further comprises a force measurement device 41. The force measurement device 41 is adapted to generate force measurement data relating to a force which is exerted on the sensor frame 20 by the sensor frame support 30.

The lithographic apparatus 1 further comprises a position control device 35. The position control device 35 is adapted to control the relative position of the substrate and the patterned radiation beam. The position control device 35 is configured to receive the force measurement data as generated by the force measurement device 41 and to control the relative position of the substrate and the patterned radiation beam based on at least the force measurement data.

For example, in a possible embodiment the lithographic apparatus 1 further comprises a substrate support which is adapted to hold the substrate during the projection of the patterned radiation beam, and the position control device 35 is adapted to control the relative position of at least one of the plurality of optical elements 11 and the substrate support. In such an embodiment, the position control device 35 is for example adapted to move the substrate support relative to the patterned radiation beam and/or relative to at least one optical element 11 of the projection system. Alternatively or in addition, the position control device 35 may be adapted to move the patterned radiation beam and/or to at least one optical element 11 of the projection system relative to the substrate support.

The position control device 35 may e.g. be embodied as a controller, microprocessor, computer or the like. In the embodiment as shown, the position control device 35 comprises an input terminal 36 for receiving input signals 44. In an embodiment, the input terminal 36 may e.g. be configured to receive the position measurement signals of the first position measurement system 21, whereby the position control system 35 may be configured to determine, based on the measurement signals as received, a position of the optical elements of the projection system. Based on this positional information, position control device 35 may e.g. generate a control signal and output this control signal 45 via an output terminal 37 of the position control device 35. Such a control signal 45 may e.g. be a control signal for controlling an operation of an actuators in order to control a position of one or more of the optical elements of the projection system.

In an embodiment, the position control device 35 comprises a deformation monitoring device 40 which is adapted to monitor a deformation of the sensor frame 20. The deformation monitoring device 40 is configured to determine the deformation of the sensor frame 20 based on the force measurement data as generated by the force measurement device 41. The determination of the force can be carried out for example by using a deformation monitoring controller 42. The deformation monitoring controller 42 may comprise a computer with a model of the sensor frame 20, which computer calculates the deformation of the sensor frame 20 based on the model of the sensor frame and the force as measured by the force measurement device 41. Optionally, the deformation monitoring controller 42 is connected to the force measurement device 41 so measurement data that is generated by the force measurement device 41 can be transferred directly the deformation monitoring controller 42. The connection between the force measurement device 41 and the deformation monitoring controller 42 can be a wired connection or a wireless connection.

The determination of the deformation of the sensor frame 20 assists in determining the desired relative position of the substrate and the patterned radiation beam. For example, a measurement of the position of the at least one optical element 11 relative to the sensor frame 20 as carried out by the first position measurement system 21 can be used by the position control device 35 to determine the desired relative position of the substrate and the patterned radiation beam and to position the substrate support and at least one optical element 11 of the projection system relative to each other accordingly. In this determination of the desired relative position of the substrate and the patterned radiation beam, the measuring error caused by the deformation of the sensor frame 20 may thus be taken into account.

Alternatively, the desired position of the patterned beam relative to the substrate may be controlled without in a separate step calculating the deformation of the sensor frame 20. In this variant, the position of the patterned beam relative to the substrate may be controlled based directly on at least the force measurement data.

In the embodiment of FIG. 2, the optical element 11 is for example supported by a force frame 60. The optical element 11 is connected to the force frame by an optical element support 61. Optionally, the optical element support 61 comprises an actuator for moving the optical element 11 relative to the force frame 60.

Optionally, the sensor frame support 30 is connected to the force frame 60 so that the sensor frame 30 is supported by the force frame 60 as well. So, in the embodiment of FIG. 2, the force frame 60 is the reference onto which the sensor frame 20 is supported.

It is noted that alternative configurations of supporting the optical element 11 and/or the sensor frame 30 in the lithographic apparatus 1 are possible as well.

The force frame 60 is optionally connected to a base frame 63 via a force frame support 62. The force frame support 62 may for example be an air mount. The base frame 63 is supported onto a support surface 65 via mount 64.

Optionally, in the embodiment shown in FIG. 2, the sensor frame support 30 comprises at least one vibration isolation system 31. The force measurement device 41 is then optionally adapted to determine the force of the vibration isolation system 31 onto the sensor frame 20. In a possible embodiment, the sensor frame support 30 comprises a plurality of vibration isolation systems 31, e.g. three or four vibration isolation systems 31.

Optionally, the vibration isolation system 31 is an active vibration isolation system, which comprises an actuator to actively move and/or actively position the sensor frame 20.

In the embodiment shown in FIG. 2, all—or at least the majority—of the external forces that act on the sensor frame 20 are exerted through the sensor frame support 30. So, measuring the force of the vibration isolation system 31 onto the sensor frame 20 provides reliable input for the determination of the deformation of the sensor frame.

Figure 3:
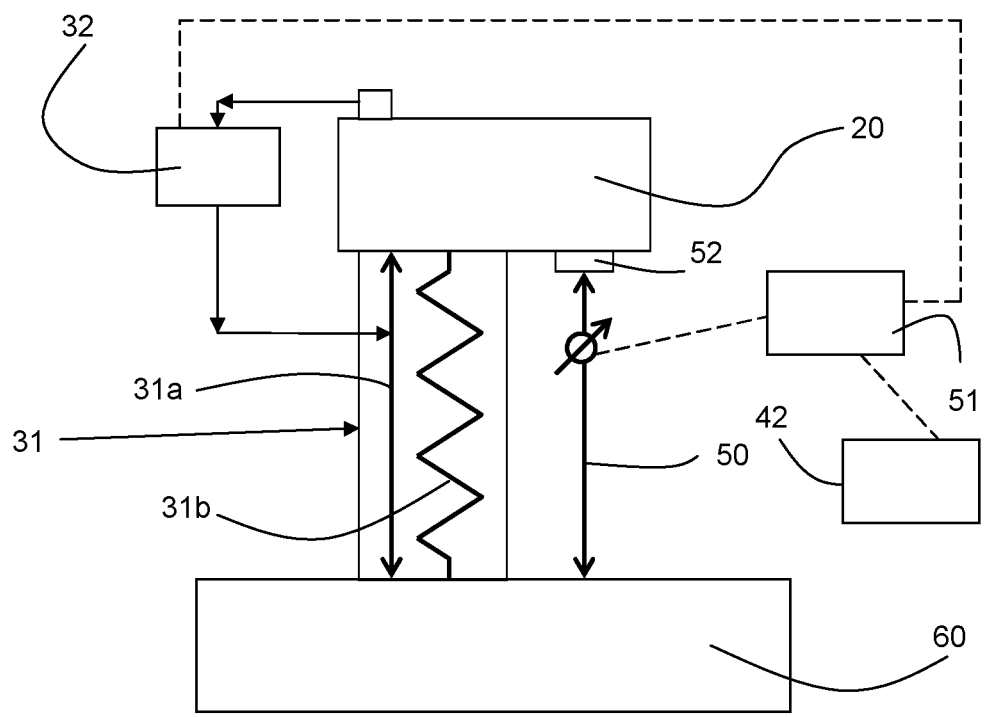

FIG. 3 schematically shows a further possible embodiment of a part of the lithographic apparatus according to the invention.

In this embodiment, the force measurement device 41 comprises a position sensor 50 adapted to determine the distance between the sensor frame 20 and the reference, e.g. the force frame 60, in at least one direction. In a possible embodiment, the position sensor 50 is configured to determine the relative displacement of the sensor frame 20 and the reference by measuring this relative displacement and monitor this distance over time, in particular during the time period in which the patterned radiation beam is projected onto the substrate. Alternatively or in addition, in case the sensor frame support 30 comprises a spring, for example when the sensor frame support 30 comprises a vibration isolation system 31 which comprises a spring 31b, the position sensor 50 may be configured to measure the compression and/or elongation of the spring and monitor these over time, in particular during the time period in which the patterned radiation beam is projected onto the substrate.

In this embodiment, the force measurement device 41 further comprises a force measurement controller 51 which is adapted to determine the force of the sensor frame support 31 onto the sensor frame 20 based on measurement data generated by the position sensor 50. When the stiffness $k_{sfs}$ of the sensor frame support in the direction in which the distance between the sensor frame 20 and the reference is determined is known, the force can be determined by the formula:

$$F = k_{sfs} \cdot x_{displ},$$

in which F represents the force in a first direction, $x_{displ}$ represents the relative displacement of the sensor frame 20 and the reference in the same first direction, and $k_{sfs}$ represents the stiffness of the sensor frame support 30 in the same first direction. So, the force is proportional to the relative displacement of the sensor frame 20 and the reference.

The deformation in the first direction of the sensor frame 20 can be determined based on this calculated force, using the following formula:

$$d = F/k_{sf},$$

wherein d represents the deformation, F represents the force as calculated from the relative displacement of the sensor frame 20 and the reference ($F = k_{sfs} \cdot x_{displ}$), and $k_{sf}$ represents the stiffness of the sensor frame 20 in the first direction.

When the deformation of the sensor frame 20 is known, for example the optical element and the substrate support can be moved relative to each other in order to obtain the correct relative position that is required for an accurate projection of the patterned radiation beam onto the substrate.

In the embodiment of FIG. 3, the sensor frame support 30 comprises a vibration isolation system 31, which comprises spring 31b. In the particular embodiment shown in FIG. 3, the vibration isolation system 31 is an active vibration isolation system, which comprises an actuator 31a in addition to the spring 31b.

In the embodiment of FIG. 3, the position sensor 50 comprises a position sensor element 52 which is arranged onto the sensor frame 20 and adjacent to the vibration isolation system 31.

In the embodiment of FIG. 3, the sensor frame support 30 further comprises a damper system 32 which is adapted to exert a damping force. In this embodiment, the force measurement controller 51 is adapted to determine the force of the sensor frame support 30 on the sensor frame based on both the damping force and measurement data generated by the position sensor 50.

The damping force can be determined by the damper system 32 itself. The damping force can be calculated using the formula:

$$F_{damp} = C \cdot a_{sf},$$

in which $F_{damp}$ represents the damping force in a first direction, C represents the damping constant and $a_{sf}$ represents the acceleration of the sensor frame 20 in the same first direction.

The acceleration of the sensor frame 20 is for example measured by acceleration sensors which form part of the damper system.

In the embodiment of FIG. 3, the damper system 32 is an active damper system. The damper system 32 is in this embodiment associated with, e.g. connected to, the actuator 31a of the vibration isolation system 31. The damper system 32 contributes to the control of the actuator 31a of the vibration isolation system, e.g. by influencing the displacement that the actuator 31a imposes upon the sensor frame 20 or by influencing the force that the actuator 31a exerts on the sensor frame 20. The damper system 32 may cause an additional force to be exerted on the sensor frame 20. This additional force is called the damping force. The damping force is the force that is exerted on top of the normal actuation force of the actuator 31a. The normal actuation force of the actuator may however be zero, in which case the damping force is the only force that is exerted by the actuator 31a.

The actuator 31a is adapted to control the movement of the sensor frame 20 at an actuation frequency. This actuation frequency is for example between 3 Hz and 10 Hz, e.g. 5 Hz or 6 Hz. The damper system 32 only generates the additional damping force onto the sensor frame 20 at or close to this actuation frequency. The actuation frequency is usually sufficiently high for acceleration sensors of the damper system 32 to provide accurate measurement data.

For the frequency or frequency range in which the damper system produces the additional damping force, the deformation of the sensor frame 20 can be corrected for the damping force by using the following formula:

$$d = P \cdot \frac{k_{sfs} \cdot x_{displ} + C \cdot a_{sf}}{k_{sf}}$$

wherein d represents the deformation, P is a proportionality factor, $x_{displ}$ represents the relative displacement of the sensor frame 20 and the reference in the same first direction, and $k_{sfs}$ represents the stiffness of the sensor frame support 30 in the same first direction, C represents the damping constant and $a_{sf}$ represents the acceleration of the sensor frame 20 in the same first direction and $k_{sf}$ represents the stiffness of the sensor frame 20 in the first direction.

In a variant of the embodiment of FIG. 3, the sensor frame support 30 comprises a plurality of vibration isolation systems 31. In this variant, the force measurement device 41 comprises a plurality of position sensors 50. Each of the position sensors 50 is adapted to determine the relative displacement in a first direction between the sensor frame and the reference, e.g. the force frame 60 adjacent to an associated vibration isolation system 31.

In this variant, the force measurement controller 51 is adapted to determine the force of the sensor frame support 30 onto the sensor frame 20 based on measurement data generated by the plurality of position sensors 50.

In a further variant of the embodiment of FIG. 3, which could be combined with the variant of the embodiment of FIG. 3 as described in the previous paragraph, the force measurement device 41 is adapted to determine the relative displacement between the sensor frame 20 and the reference, e.g. the force frame 60, in multiple, e.g. six, degrees of freedom. In this variant, the force measurement controller 51 is adapted to determine the force of the sensor frame support 30 onto the sensor frame 20 based on the determination of the relative displacement of the sensor frame 20 and the reference, e.g. the force frame 60, in the multiple, e.g. six, degrees of freedom.

Figure 4:
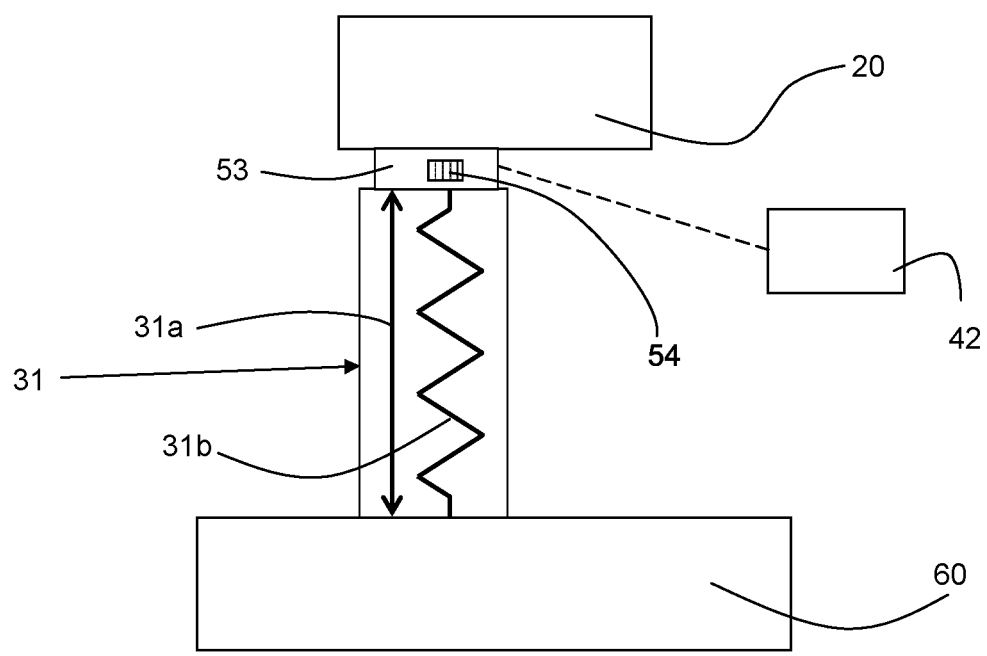
FIG. 4 schematically shows a further possible embodiment of a part of the lithographic apparatus according to the invention, FIG. 5 schematically shows a further possible embodiment of a part of the lithographic apparatus according to the invention.

FIG. 4 schematically shows a further possible embodiment of a part of the lithographic apparatus according to the invention.

In the embodiment of FIG. 4, the force measurement device 41 comprises at least one strain gauge 54.

The strain gauge 54 is for example arranged on a sensor block 53 which is arranged between the sensor frame support 30 and the sensor frame 20. Alternatively, the sensor block 53 may be arranged between the sensor frame support 30 and the reference, which reference is for example the force frame 60.

The sensor block 53 may be a solid block, e.g. made of metal such as stainless steel. Alternatively, the sensor block 53 may comprise one or more cuts in one or more directions in order to provide one or more elastic hinges in the sensor block 53.

Optionally, the sensor block 53 comprises a plurality of strain gauges 54, which may be arranged to measure the deformation of the sensor block 53 in different directions.

Figure 5:
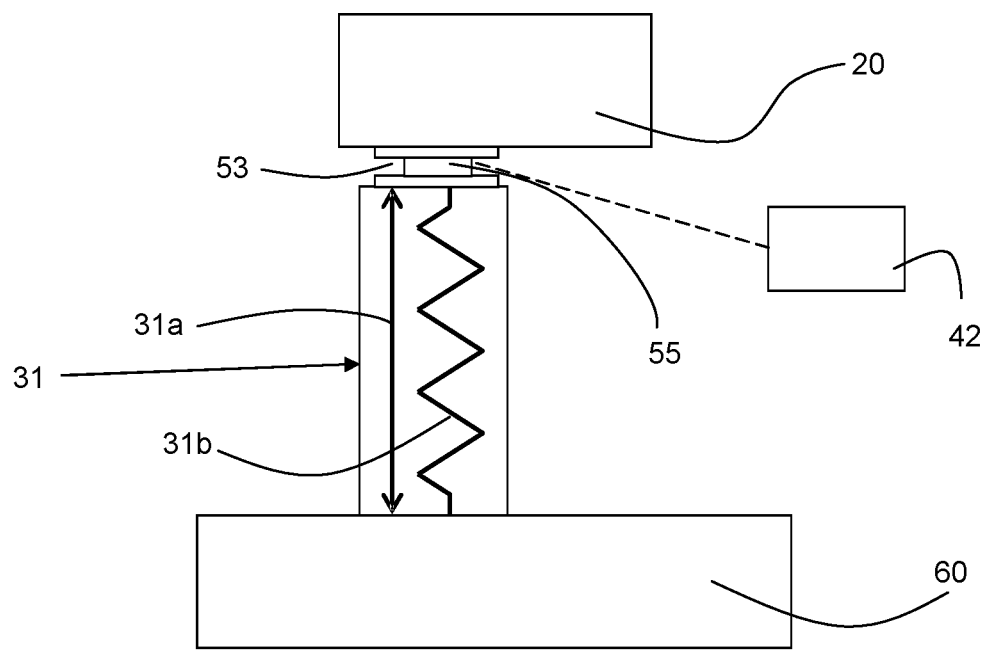

FIG. 5 schematically shows a further possible embodiment of a part of the lithographic apparatus according to the invention.

In the embodiment of FIG. 5, the force measurement device 41 comprises at least one piezo-electric force sensor 55.

The piezo-electric force sensor 55 is for example arranged in a sensor block 53 which is arranged between the sensor frame support 30 and the sensor frame 20. Alternatively, the sensor block 53 may be arranged between the sensor frame support 30 and the reference, which reference is for example the force frame 60.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
a projection system configured to project a patterned radiation beam onto a substrate; the projection system comprising a plurality of optical elements;
a sensor frame;
a first position measurement system configured to measure a position of at least one of the plurality of optical elements relative to the sensor frame, wherein the position measurement system comprises at least one sensor configured to monitor one of the plurality of optical elements, wherein the at least one sensor comprises at least one sensor element mounted to a first side of the sensor frame;
a sensor frame support configured to support the sensor frame on a reference frame;
a force measurement device disposed at a second side of the sensor frame opposite to the first side and configured to generate force measurement data relating to a force that is exerted on the sensor frame by the sensor frame support; and
a position controller configured to control the relative position of the substrate and the patterned radiation beam, wherein the position controller is further configured to receive the force measurement data and to control the relative position of the substrate and the patterned radiation beam based on at least the force measurement data.

2. A lithographic apparatus according to claim 1,
wherein the position controller comprises a deformation monitoring detector configured to determine a deformation of the sensor frame based on a model of the sensor frame and the measured force associated with the force measurement data.

3. A lithographic apparatus according to claim 1,
wherein the lithographic apparatus further comprises a substrate support configured to hold the substrate during the projection of the patterned radiation beam, and
wherein the position controller is further configured to control the relative position of at least one of the plurality of optical elements and the substrate support.

4. A lithographic apparatus according to claim 1,
wherein the sensor frame support comprises at least one vibration isolation system, and wherein the force measurement device is further configured to determine the force of the vibration isolation system onto the sensor frame.

5. A lithographic apparatus according to claim 1,
wherein the force measurement device comprises a position sensor configured to determine the relative displacement of the sensor frame and the reference frame in at least one direction, and further comprises a force measurement controller that is configured to determine the force exerted by the sensor frame support onto the sensor frame based on measurement data generated by the position sensor.

6. A lithographic apparatus according to claim 5,
wherein the sensor frame support comprises a damper configured to exert a damping force, and wherein the force measurement controller is configured to determine the force exerted by the sensor frame support on the sensor frame based on both the damping force and measurement data generated by the position sensor.

7. A lithographic apparatus according to claim 5,
wherein the position sensor comprises a position sensor element that is disposed on the sensor frame and is adjacent to the vibration isolation system.

8. A lithographic apparatus according to claim 5,
wherein the sensor frame support comprises a plurality of vibration isolation systems, and
wherein the force measurement device comprises a plurality of further position sensors, each of the plurality of further position sensors being configured to determine the relative displacement in a first direction between the sensor frame and the force frame adjacent to an associated vibration isolation system,
and wherein the force measurement controller is configured to determine the force exerted by the sensor frame support onto the sensor frame based on measurement data generated by the plurality of further position sensors.

9. A lithographic apparatus according claim 5,
wherein the force measurement device is configured to determine the relative displacement of the sensor frame and the reference frame in multiple degrees of freedom, and wherein the force measurement controller is configured to determine the force exerted by the sensor frame support onto the sensor frame based on the determination of the relative displacement of the sensor frame and the force frame in the multiple degrees of freedom.

10. A lithographic apparatus according to claim 1,
wherein the force measurement device comprises at least one piezo-electric force sensor.

11. A lithographic apparatus according to claim 1,
wherein the force measurement device comprises at least one strain gauge.

12. A lithographic apparatus according to claim 1,
wherein the reference frame comprises a force frame configured to support the plurality of optical elements and the sensor frame, and wherein the sensor frame support is arranged between the sensor frame and the force frame.

13. A lithographic apparatus according to claim 1,
wherein the lithographic apparatus is arranged to transfer a pattern from a patterning device onto a substrate.

14. A lithographic apparatus comprising:
an illumination system configured to condition a radiation beam;
a support configured to support a patterning device, the patterning device being capable of imparting to the radiation beam a pattern in its cross-section to form a patterned radiation beam;
a projection system configured to project the patterned radiation beam onto a substrate, wherein the projection system comprises a plurality of optical elements,
a sensor frame,
a first position measurement system configured to measure a position of at least one of the plurality of optical elements relative to the sensor frame, wherein the position measurement system comprises at least one sensor configured to monitor one of the plurality of optical elements, the sensor comprising at least one sensor element which is mounted to the sensor frame,
a sensor frame support configured to support the sensor frame on a reference frame,
a force measurement device disposed at a second side of the sensor frame opposite to the first side and configured to generate force measurement data relating to a force that is exerted on the sensor frame by the sensor frame support; and
a position controller configured to control the relative position of the substrate and the patterned radiation beam, wherein the position controller is further configured to receive the force measurement data and to control the relative position of the substrate and the patterned radiation beam based on at least the force measurement data.

15. A lithographic projection apparatus arranged to project a pattern from a patterning device onto a substrate, comprising:
a projection system configured to project the patterned radiation beam onto a substrate, wherein the projection system comprises a plurality of optical elements,
a sensor frame,
a first position measurement system configured to measure a position of at least one of the plurality of optical elements relative to the sensor frame, wherein the position measurement system comprises at least one sensor configured to monitor one of the plurality of optical elements the sensor comprising at least one sensor element which is mounted to the sensor frame,
a sensor frame support configured to support the sensor frame on a reference frame,
a force measurement device disposed at a second side of the sensor frame opposite to the first side and configured to generate force measurement data relating to a force that is exerted on the sensor frame by the sensor frame support; and
a position controller configured to control the relative position of the substrate and the patterned radiation beam, wherein the position controller device is further configured to receive the force measurement data and to control the relative position of the substrate and the patterned radiation beam based on at least the force measurement data.

16. A method of manufacturing a device, the method comprising:
transferring a pattern from a patterning device onto a substrate using a lithographic apparatus comprising:
a projection system configured to project the patterned radiation beam onto a substrate, wherein the projection system comprises a plurality of optical elements,
a sensor frame,
a first position measurement system configured to measure a position of at least one of the plurality of optical elements relative to the sensor frame, wherein the position measurement system comprises at least one sensor configured to monitor one of the plurality of optical elements the sensor comprising at least one sensor element which is mounted to the sensor frame,
a sensor frame support configured to support the sensor frame on a reference frame,
a force measurement device disposed at a second side of the sensor frame opposite to the first side and configured to generate force measurement data relating to a force that is exerted on the sensor frame by the sensor frame support; and
a position controller configured to control the relative position of the substrate and the patterned radiation beam, wherein the position controller device is further configured to receive the force measurement data and to control the relative position of the substrate and the patterned radiation beam based on at least the force measurement data.

17. A method of manufacturing a device, the method comprising:
projecting a patterned radiation beam onto a substrate, comprising the step of using a lithographic apparatus comprising:
a projection system configured to project the patterned radiation beam onto a substrate, wherein the projection system comprises a plurality of optical elements,
a sensor frame,
a first position measurement system configured to measure a position of at least one of the plurality of optical elements relative to the sensor frame, wherein the position measurement system comprises at least one sensor configured to monitor one of the plurality of optical elements the sensor comprising at least one sensor element which is mounted to the sensor frame,
a sensor frame support configured to support the sensor frame on a reference frame,
a force measurement device disposed at a second side of the sensor frame opposite to the first side and configured to generate force measurement data relating to a force that is exerted on the sensor frame by the sensor frame support; and
a position controller configured to control the relative position of the substrate and the patterned radiation beam, wherein the position controller device is further configured to receive the force measurement data and to control the relative position of the substrate and the patterned radiation beam based on at least the force measurement data.

* * * * *

UNITED STATES PATENT AND TRADEMARK OFFICE
CERTIFICATE OF CORRECTION

PATENT NO. : 10,955,761 B2
APPLICATION NO. : 16/482515
DATED : March 23, 2021
INVENTOR(S) : Butler et al.

Page 1 of 1

It is certified that error appears in the above-identified patent and that said Letters Patent is hereby corrected as shown below:

In the Claims

In Column 15, Line 46, replace "elements the sensor" with --elements, the sensor--.

In Column 16, Line 30, replace "elements the sensor" with --elements, the sensor--.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*